(12) United States Patent
Zhu et al.

(10) Patent No.: US 12,074,105 B2
(45) Date of Patent: Aug. 27, 2024

(54) SELF-ALIGNED CONTACTS IN THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Hongbin Zhu, Wuhan (CN); Juan Tang, Wuhan (CN); Zi Qun Hua, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/070,184

(22) Filed: Nov. 28, 2022

(65) Prior Publication Data
US 2023/0102519 A1 Mar. 30, 2023

Related U.S. Application Data

(63) Continuation of application No. 16/576,633, filed on Sep. 19, 2019, now Pat. No. 11,552,012, which is a
(Continued)

(51) Int. Cl.
*H01L 23/522* (2006.01)
*H01L 21/768* (2006.01)
(Continued)

(52) U.S. Cl.
CPC ...... *H01L 23/5226* (2013.01); *H01L 23/5283* (2013.01); *H10B 43/27* (2023.02); *H10B 43/35* (2023.02)

(58) Field of Classification Search
CPC ............. H01L 23/5283; H01L 23/5226; H01L 21/76897; H10B 43/27; H10B 43/35
See application file for complete search history.

(56) References Cited

U.S. PATENT DOCUMENTS

| 2010/0213526 A1 | 8/2010 | Wada et al. |
| 2015/0179660 A1 | 6/2015 | Yada et al. |
| (Continued) | | |

FOREIGN PATENT DOCUMENTS

| CN | 101151720 A | 3/2008 |
| CN | 101330072 A | 12/2008 |
| (Continued) | | |

OTHER PUBLICATIONS

International Search Report issued in corresponding International Application No. PCT/CN2019/096195, mailed Apr. 20, 2019, 4 pages.
(Continued)

*Primary Examiner* — Antonio B Crite
(74) *Attorney, Agent, or Firm* — BAYES PLLC

(57) ABSTRACT

Embodiments of 3D memory devices are disclosed. In an example, a 3D memory device includes a memory stack, a structure penetrating the memory stack; a dielectric stack on the memory stack, and a contact structure penetrating the dielectric stack and being in contact with the structure. The dielectric stack comprises a first dielectric layer and a second dielectric layer having a first dielectric material, and an intermedia dielectric layer sandwiched by the first dielectric layer and the second dielectric layer, and having a second dielectric material different from the first dielectric material. The contact structure comprises a lower contact portion penetrating the first dielectric layer and the intermedia dielectric layer, the lower contact portion having a first lateral dimension, and an upper contact portion penetrating the second dielectric layer, the upper contact portion having a second lateral dimension less than the first lateral dimension.

20 Claims, 10 Drawing Sheets

Related U.S. Application Data continuation of application No. PCT/CN2019/096195, filed on Jul. 16, 2019.

(51) Int. Cl.
*H01L 23/528* (2006.01)
*H10B 43/27* (2023.01)
*H10B 43/35* (2023.01)

(56) References Cited

U.S. PATENT DOCUMENTS

| | | |
|---|---|---|
| 2016/0111437 A1 | 4/2016 | Pang et al. |
| 2016/0163725 A1 | 6/2016 | Kamiya et al. |
| 2016/0163728 A1 | 6/2016 | Tsutsumi et al. |
| 2016/0307917 A1 | 10/2016 | Yada et al. |
| 2017/0025421 A1* | 1/2017 | Sakakibara ............ H10B 41/27 |
| 2019/0035808 A1 | 1/2019 | Hwang et al. |
| 2019/0067314 A1 | 2/2019 | Lu et al. |
| 2019/0067320 A1* | 2/2019 | Cho .................... H01L 23/5226 |
| 2020/0203364 A1 | 6/2020 | Totoki et al. |

FOREIGN PATENT DOCUMENTS

| | | |
|---|---|---|
| CN | 107810552 A | 3/2018 |
| CN | 108511447 A | 9/2018 |
| CN | 109285839 A | 1/2019 |
| CN | 109314116 A | 2/2019 |

OTHER PUBLICATIONS

Written Opinion of the International Searching Authority issued in corresponding International Application No. PCT/CN2019/096195, mailed Apr. 20, 2019, 4 pages.

* cited by examiner

SELF-ALIGNED CONTACTS IN THREE-DIMENSIONAL MEMORY DEVICES AND METHODS FOR FORMING THE SAME

CROSS-REFERENCE TO RELATED APPLICATIONS

This application is a continuation of U.S. application Ser. No. 16/576,633, filed on Sep. 19, 2019, which is a continuation of International Application No. PCT/CN2019/096195, filed on Jul. 16, 2019, the entire contents of which are incorporated herein by references.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack including interleaved conductive layers and dielectric layers above the substrate, a structure extending vertically through the memory stack, a first dielectric layer on the memory stack, an etch stop layer on the first dielectric layer, a second dielectric layer on the etch stop layer, a first contact through the etch stop layer and the first dielectric layer and in contact with an upper end of the structure, and a second contact through the second dielectric layer and in contact with at least an upper end of the first contact.

In another example, a method for forming a 3D memory device is disclosed. A structure extending vertically through a memory stack including interleaved conductive layers and dielectric layers is formed above a substrate. A first dielectric layer is formed on the memory stack. An etch stop layer is formed on the first dielectric layer. A first contact is formed through the etch stop layer and the first dielectric layer and in contact with an upper end of the structure. A second dielectric layer is formed on the etch stop layer. A second contact is formed through the second dielectric layer and in contact with at least an upper end of the first contact.

In still another example, a method for forming a 3D memory device is disclosed. A channel structure extending vertically through a memory stack including interleaved conductive layers and dielectric layers is formed above a substrate. A first silicon oxide layer is deposited on the memory stack. A silicon nitride layer is deposited on the first silicon oxide layer. A first contact opening is etched through the silicon nitride layer and the first silicon oxide layer until being stopped by an upper end of the channel structure. The first contact opening is filled with a metal material to form a first contact in contact with the upper end of the channel structure. A second silicon oxide layer is deposited on the silicon nitride layer. A second contact opening is etched through the second silicon oxide layer until being stopped by an upper end of the first contact and the silicon nitride layer. The second contact opening is filled with the metal material to form the second contact in contact with the upper end of the first contact and the silicon nitride layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
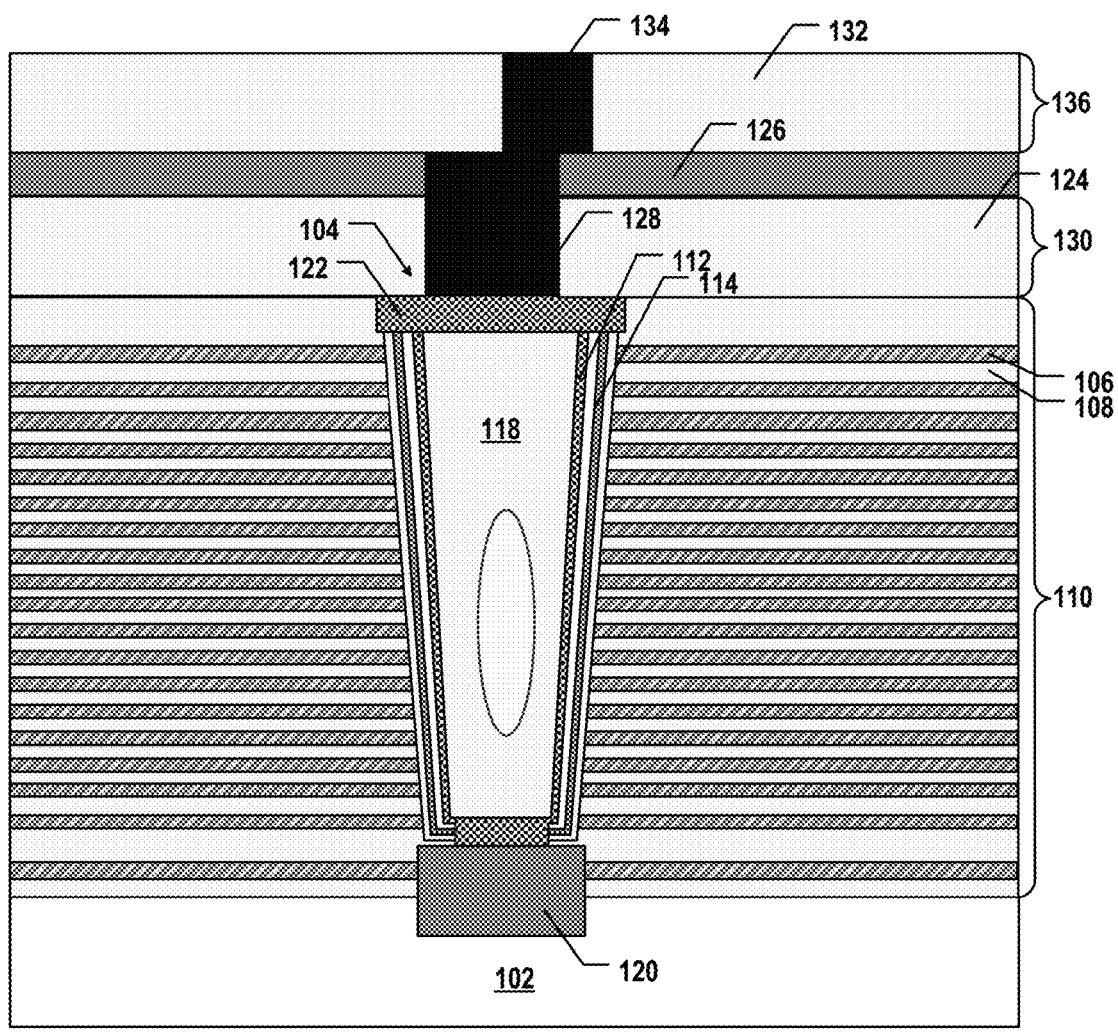
FIG. 1A illustrates a cross-section of an exemplary 3D memory device with self-aligned contacts, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In 3D memory devices fabrication, it is often necessary to achieve precise alignment and overlay control between structures fabricated at different lithographic stages. Tighter alignment tolerances and overlay issues become exasperated as the memory density and interconnect density continue increasing. For example, the misalignment and partial overlap of contacts in different layers may cause yield loss due to a short circuit with the misaligned contact.

Various embodiments in accordance with the present disclosure provide self-aligned contacts in 3D memory devices with relaxed alignment and overlay constraints. As a result, short circuits with misaligned contacts can be prevented to minimize yield loss. The self-aligned contacts are applicable to various interconnect structures in 3D memory devices, such as the local contacts (known as "C1") and the contacts right above (known as "VO") for channel structures and slit structures (e.g., functioning as array common source "ACS").

FIG. 1A illustrates a cross-section of an exemplary 3D memory device 100 with self-aligned contacts, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in the form of an array of NAND memory strings each extending vertically above substrate 102. The memory array device can include an array of channel structures 104 functioning as the array of NAND memory strings. As shown in FIG. 1, channel structure 104 can extend vertically through a plurality of pairs each including a conductive layer 106 and a dielectric layer 108. The interleaved conductive layers 106 and dielectric layers 108 are part of a memory stack 110. The number of the pairs of conductive layers 106 and dielectric layers 108 in memory stack 110 (e.g., 32, 64, 96, or 128) determines the number of memory cells in 3D memory device 100. It is understood that in some embodiments, memory stack 110 may have a multi-deck architecture (not shown), which includes a plurality of memory decks stacked over one another. The numbers of the pairs of conductive layers 106 and dielectric layers 108 in each memory deck can be the same or different.

Memory stack 110 can include a plurality of interleaved conductive layers 106 and dielectric layers 108. Conductive layers 106 and dielectric layers 108 in memory stack 110 can alternate in the vertical direction. In other words, except the ones at the top or bottom of memory stack 110, each conductive layer 106 can be adjoined by two dielectric layers 108 on both sides, and each dielectric layer 108 can be adjoined by two conductive layers 106 on both sides. Conductive layers 106 can include conductive materials including, but not limited to, tungsten (W), cobalt (Co), copper (Cu), aluminum (Al), polysilicon, doped silicon, silicides, or any combination thereof. Each conductive layer 106 can be a gate electrode (gate line) surrounding channel structure 104 and can extend laterally as a word line. Dielectric layers 108 can include dielectric materials including, but not limited to, silicon oxide, silicon nitride, silicon oxynitride, or any combination thereof.

As shown in FIG. 1, channel structure 104 can include a channel hole filled with a semiconductor layer (e.g., as a semiconductor channel 112) and a composite dielectric layer (e.g., as a memory film 114). In some embodiments, semiconductor channel 112 includes silicon, such as amorphous silicon, polysilicon, or single-crystal silicon. In some embodiments, memory film 114 is a composite layer including a tunneling layer, a storage layer (also known as a "charge trap layer"), and a blocking layer. The remaining space of channel structure 104 can be partially or fully filled with a capping layer 118 including dielectric materials, such as silicon oxide, and/or an air gap. Channel structure 104 can have a cylinder shape (e.g., a pillar shape). Capping layer 118, semiconductor channel 112, the tunneling layer, storage layer, and blocking layer of memory film 114 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 114 can include a composite layer of silicon oxide/silicon oxynitride/silicon oxide (ONO).

In some embodiments, channel structure 104 further includes a semiconductor plug 120 in the lower portion (e.g., at the lower end) of channel structure 104. As used herein, the "upper end" of a component (e.g., channel structure 104) is the end farther away from substrate 102 in the y-direction, and the "lower end" of the component (e.g., channel structure 104) is the end closer to substrate 102 in the y-direction when substrate 102 is positioned in the lowest plane of 3D memory device 100. Semiconductor plug 120 can include a semiconductor material, such as silicon, which is epitaxially grown from substrate 102 in any suitable directions. It is understood that in some embodiments, semiconductor plug 120 includes single-crystal silicon, the same material of substrate 102. In other words, semiconductor plug 120 can include an epitaxially-grown semiconductor layer that is the same material as substrate 102. Semiconductor plug 120 can be below and in contact with the lower end of semiconductor channel 112. Semiconductor plug 120 can function as a channel controlled by a source select gate of the NAND memory string.

In some embodiments, channel structure 104 further includes a channel plug 122 in the upper portion (e.g., at the upper end) of channel structure 104. Channel plug 122 can be above and in contact with the upper end of semiconductor channel 112. Channel plug 122 can include semiconductor materials (e.g., polysilicon). In some embodiments, channel plug 122 includes an opening filled with a conductive layer, including a metal material such as tungsten. By covering the upper end of channel structure 104 during the fabrication of 3D memory device 100, channel plug 122 can function as an etch stop layer to prevent etching of dielectrics filled in channel structure 104. In some embodiments, channel plug 122 can function as the drain of the NAND memory string.

As shown in FIG. 1, 3D memory device 100 includes a local contact layer 130 on memory stack 110 as part of the interconnect structure. Local contact layer 130 can include a first dielectric layer 124 formed on memory stack 110. In some embodiments, first dielectric layer 124 is formed on the upper end of channel structure 104 and the top surface of memory stack 110 without any intervening layer. First dielectric layer 124 can include one or more interlayer dielectric (ILD) layers (also known as "intermetal dielectric (IMD) layers"). First dielectric layer 124 of local contact layer 130 can include dielectric materials including, but not limited to, silicon oxide, silicon nitride, silicon oxynitride, low dielectric constant (low-k) dielectrics, or any combination thereof. In some embodiments, the dielectric material of first dielectric layer 124 includes silicon oxide.

As shown in FIG. 1, 3D memory device 100 also includes an etch stop layer 126 on first dielectric layer 124 of local contact layer 130. In some embodiments, etch stop layer 126 is formed on the top surface of first dielectric layer 124 without any intervening layer. Etch stop layer 126 can include dielectric materials including, but not limited to, silicon nitride, silicon oxynitride, high dielectric constant (high-k) dielectrics, or any combination thereof. The high-k dielectrics can include aluminum oxide ($Al_2O_3$), hafnium oxide ($HfO_2$), zirconium oxide ($ZrO_2$), to name a few. In some embodiments, etch stop layer 126 includes a dielectric material that is different from the dielectric material of first dielectric layer 124. For example, the dielectric material of etch stop layer 126 includes silicon nitride, and the dielectric material of first dielectric layer 124 includes silicon oxide. It is understood that in some embodiments, first dielectric layer 124 and etch stop layer 126 may have the same dielectric material.

Local contact layer 130 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. The interconnects in local contact layer 130 are referred to herein as "local contacts" (also known as "C1"), which are in contact with a structure in memory stack 110 directly. As shown in FIG. 1, local contact layer 130 includes a first contact 128 (e.g., a local contact for channel structure 104) above and in contact with the upper end of channel structure 104 (e.g., channel plug 122). The local contacts, including first contact 128, in local contact layer 130 can include conductive materials including, but not limited to, Cu, Al, W, Co, silicides, or any combination thereof. In some embodiments, the conductive material of first contact 128 includes tungsten.

The local contacts, including first contact 128, in local contact layer 130 are formed through first dielectric layer 124. That is, local contact layer 130 can include first dielectric layer 124 and first contact 128 therethrough. As shown in FIG. 1, first contact 128 extends further through etch stop layer 126. That is, first contact 128 is formed through both first dielectric layer 124 and etch stop layer 126 and in contact with the upper end of channel structure 104. In some embodiments, the upper end of first contact 128 is flush with the top surface of etch stop layer 126.

As shown in FIG. 1, 3D memory device 100 further includes an interconnect layer 136 on etch stop layer 126 as part of the interconnect structure. Interconnect layer 136 can include a second dielectric layer 132 formed on etch stop layer 126. In some embodiments, second dielectric layer 132 is formed on the top surface of etch stop layer 126 without any intervening layer. Second dielectric layer 132 can include one or more ILD layers. Second dielectric layer 132 of interconnect layer 136 can include dielectric materials including, but not limited to, silicon oxide, silicon nitride, silicon oxynitride, low-k dielectrics, or any combination thereof. In some embodiments, the dielectric material of second dielectric layer 132 is the same as the dielectric material of first dielectric layer 124. For example, the dielectric material of first and second dielectric layers 124 and 132 includes silicon oxide.

In some embodiments, the dielectric material of second dielectric layer 132 is different from the dielectric material of etch stop layer 126. Moreover, in order for etch stop layer 126 to function (i.e., automatically stop the etching of second dielectric layer 132 when the etching reaches to etch stop layer 126), the etch selectivity between the dielectric material of second dielectric layer 132 and the dielectric material of etch stop layer 126 is not less than about 5:1, such as not less than 5:1 (e.g., 5:1, 6:1, 7:1, 8:1, 9:1, 10:1, 11:1, 12:1, 13:1. 14:1, 15:1, 16:1, 17:1, 18:1, 19:1, 20:1, 25:1, 30:1, 40:1, 50:1, 60:1, 70:1, 80:1, 90:1, 100:1, 200:1, 300:1, 400:1, 500:1, any range bounded by the lower end by any of these values, or in any range defined by any two of these values). In some embodiments, the dielectric material of second dielectric layer 132 includes silicon oxide, and the dielectric material of etch stop layer includes silicon nitride with an etch selectivity greater than 50:1 over silicon nitride.

Due to the structures (e.g., second dielectric layer 132 on etch stop layer 126) and materials (e.g., different dielectric materials with a high etch selectivity) of etch stop layer 126 and second dielectric layer 132, etching of second dielectric layer 132 for forming any contact therethrough is stopped by etch stop layer 126. As a result, interconnect layer 136 can include a plurality of self-aligned contacts (SACs, also known as "V0") including a second contact 134 (e.g., a V0 via contact for channel structure 104) in contact with at least the upper end of first contact 128. The contacts, including second contact 134, in interconnect layer 136 can include conductive materials including, but not limited to, Cu, Al, W, Co, silicides, or any combination thereof. In some embodiments, the conductive material of second contact 134 includes tungsten. In some embodiments, the critical dimension of first contact 128 is greater than the critical dimension of second contact 134. For example, the diameter of first contact 128 (e.g., a via contact) may be greater than the diameter of second contact 134 (e.g., a via contact). As a result, when second contact 134 is well aligned with first contact 128, second contact 134 can fully land on first contact 128 as part of the electrical connection for channel structure 104, for example, with a bit line.

The contacts, including second contact 134, in interconnect layer 136 are formed through second dielectric layer 132. That is, interconnect layer 136 can include second dielectric layer 132 and second contact 134 therethrough. As shown in FIG. 1, second contact 134 is formed through second dielectric layer 132 and in contact with the upper end of first contact 128 as well as the top surface of etch stop layer 126. In some embodiments, the lower end of second contact 134 is flush with the top surface of etch stop layer 126. That is, even if second contact 134 does not fully land on first contact 128 due to misalignment (e.g., as shown in FIG. 1), the portion of second contact 134 outside of first contact 128 cannot extend further through etch stop layer 126 to form a short circuit, for example, with components in memory stack 110 (e.g., conductive layers 106) after extending through first dielectric layer 124. As a result, the alignment margin and overlay control between first and second contacts 128 and 134 can be relaxed by the SAC scheme with etch stop layer 126. It is understood that in some embodiments, second contact 134 may be well aligned with first contact 128, such that second contact 134 fully lands on first contact 128 without being in contact with etch stop layer 126.

Figure 1B:
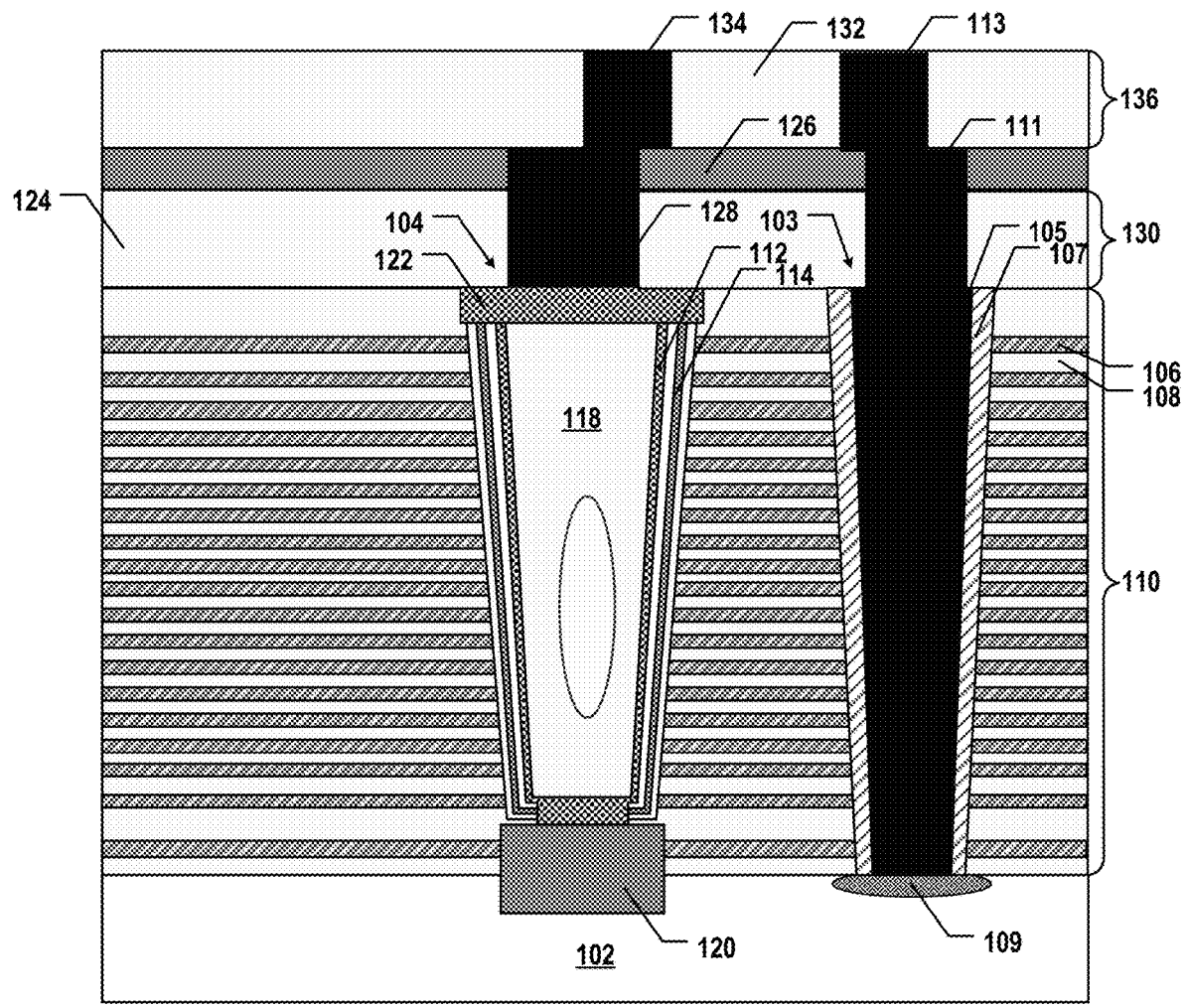
FIG. 1B and FIG. 1C each illustrates a cross-section of another exemplary 3D memory device with self-aligned contacts, according to some embodiments of the present disclosure.

It is understood that the SAC scheme with etch stop layer 126 described above with respect to FIG. 1 is not limited to the interconnect structure for channel structure 104 and can be applied to the interconnect structures or any other suitable structures extending vertically through memory stack 110, such as slit structures, through array contacts (TACs), etc. FIG. 1B illustrates a cross-section of another exemplary 3D memory device 101 with self-aligned contacts, according to some embodiments of the present disclosure. Different from 3D memory device 100 described above in FIG. 1A, 3D memory device 101 in FIG. 1B further includes a slit structure 103 having an interconnect structure employing the SAC scheme with etch stop layer 126. It is understood that the details of similar structures (e.g., materials, fabrication process, functions, etc.) in both 3D memory devices 100 and 101 may not be repeated below.

Figure 1C:
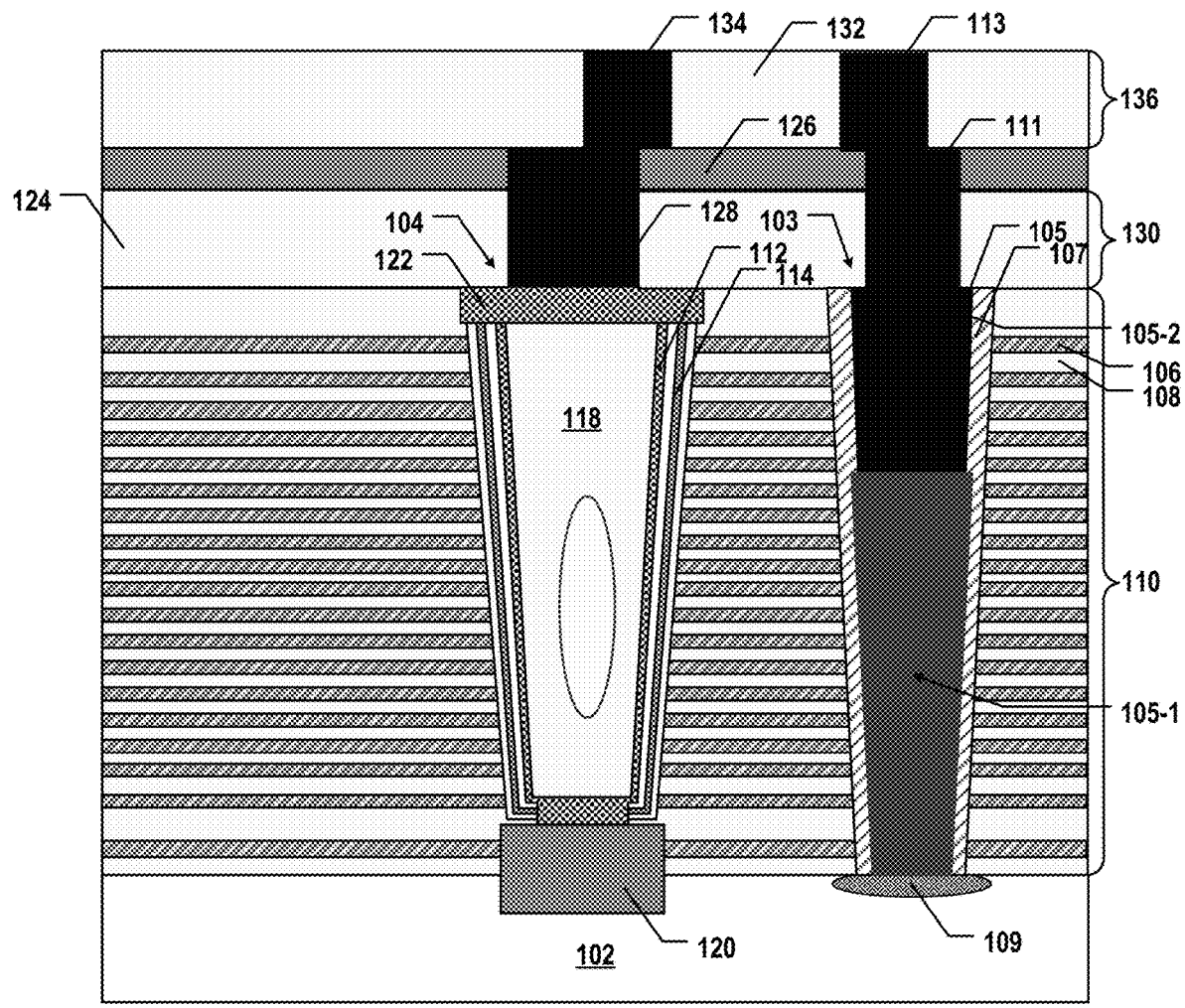

As shown in FIG. 1B, 3D memory device 101 further includes slit structure 103 extending vertically through interleaved conductive layers 106 and dielectric layers 108 of memory stack 110. Slit structure 103 can also extend laterally to separate memory stack 110 into multiple blocks. Slit structure 103 can include a slit opening that provides access for the chemical precursor to form conductive layers 106. In some embodiments, slit structure 103 includes a source conductive layer 105 having conductive materials including, but not limited to, W, Co, Cu, Al, polysilicon, silicides, or any combination thereof. In some embodiments as shown in FIG. 1C, source conductive layer 105 includes polysilicon in the lower portion 105-1 of the slit opening and a metal (e.g., tungsten) in the upper portion 105-2 of the slit opening. To electrically isolate source conductive layer 105 from conductive layers 106, slit structure 103 can further include a spacer 107 disposed along the sidewall of the slit opening and in etch-back recesses (not shown) abutting the sidewall of the slit opening. That is, spacer 107 can be formed between source conductive layer 105 and conductive layers 106 in memory stack 110. Spacer 107 can include one or more layers of dielectric materials, such as silicon oxide, silicon nitride, silicon oxynitride, or any combination thereof. In some embodiments, source conductive layer 105 of slit structure 103 works as the source contact of 3D memory device 101 and electrically connects to the source of the NAND memory string, e.g., an array common source (ACS) of the array of NAND memory strings. In some embodiments, slit structure 103 further includes a doped region 109 at its lower end in substrate 102 to reduce the resistance of the electrical connection with the ACS.

As shown in FIG. 1B, local contact layer 130 can further include another first contact 111 (e.g., the local contact for silt structure 103) through first dielectric layer 124 and in contact with the upper end of slit structure 103. Similar to first contact 128, another first contact 111 is formed through both etch stop layer 126 and first dielectric layer 124, according to some embodiments. The upper surface of another first contact 111 can be flush with the top surface of etch stop layer 126. Interconnect layer 136 can include another second contact 113 as another SAC with relaxed alignment margin and overlay control with another first contact 111 as described above in detail. The lower surface of another second contact 113 can be flush with the top surface of etch stop layer 126. It is to be understood that the number of interconnect layers in 3D memory devices 100 and 101 is not limited by the examples in FIGS. 1A and 1B. Additional interconnect layer(s) with contacts can be formed using the SAC scheme disclosed herein.

FIGS. 2A-2F illustrate a fabrication process for forming an exemplary 3D memory device with self-aligned contacts, according to some embodiments of the present disclosure. FIG. 3 illustrates a flowchart of a method 300 for forming an exemplary 3D memory device with self-aligned contacts, according to some embodiments of the present disclosure. Examples of the 3D memory device depicted in FIGS. 2A-2F and 3 include 3D memory device 100 depicted in FIG. 1A. FIGS. 2A-2F and 3 will be described together. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a structure extending vertically through a memory stack including interleaved conductive layers and dielectric layers is formed above a substrate. The structure is a channel structure or a slit structure, according to some embodiments. The substrate can be a silicon substrate.

Figure 2A:
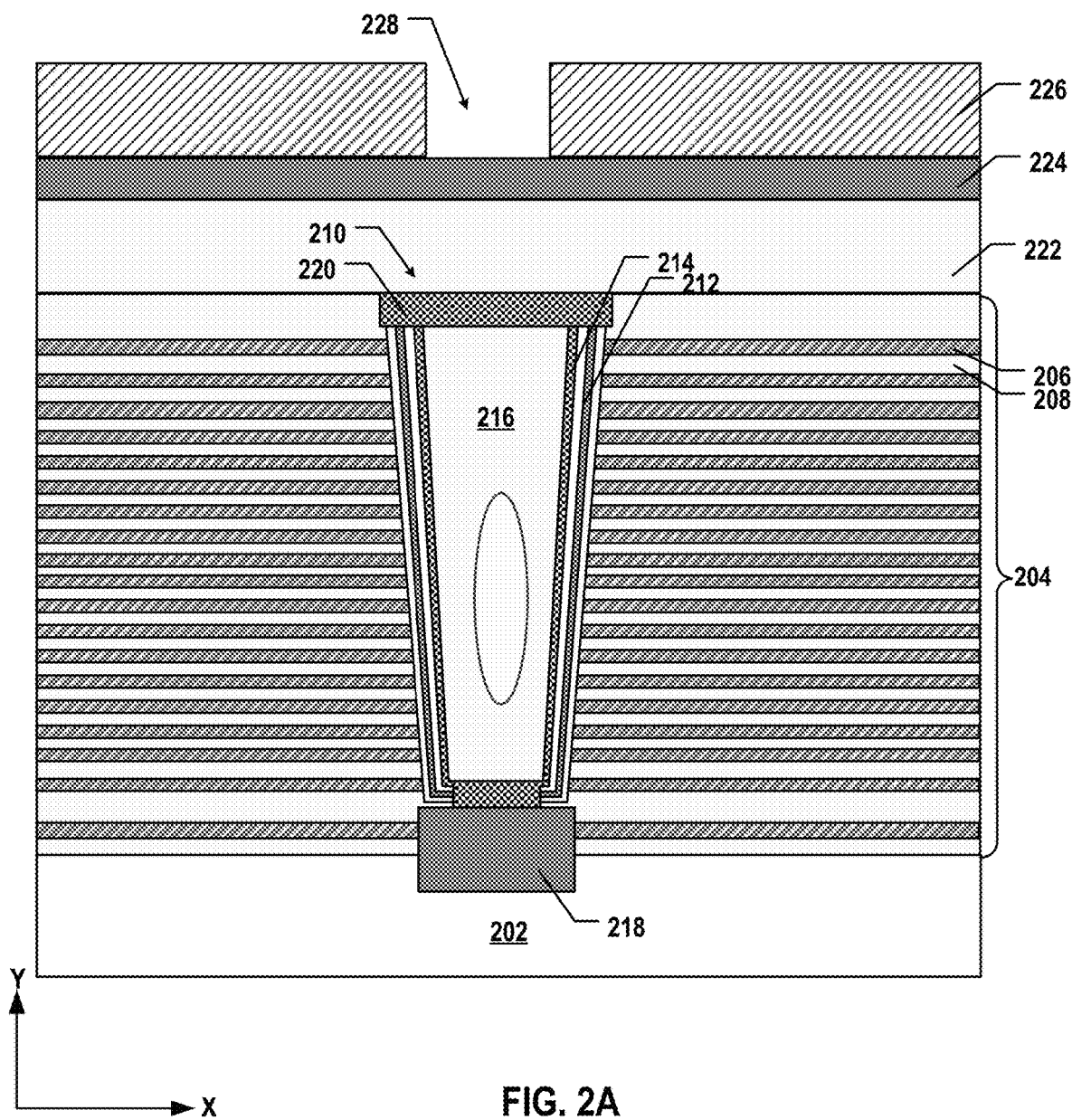
FIGS. 2A-2F illustrate a fabrication process for forming an exemplary 3D memory device with self-aligned contacts, according to some embodiments of the present disclosure.
Figure 3:
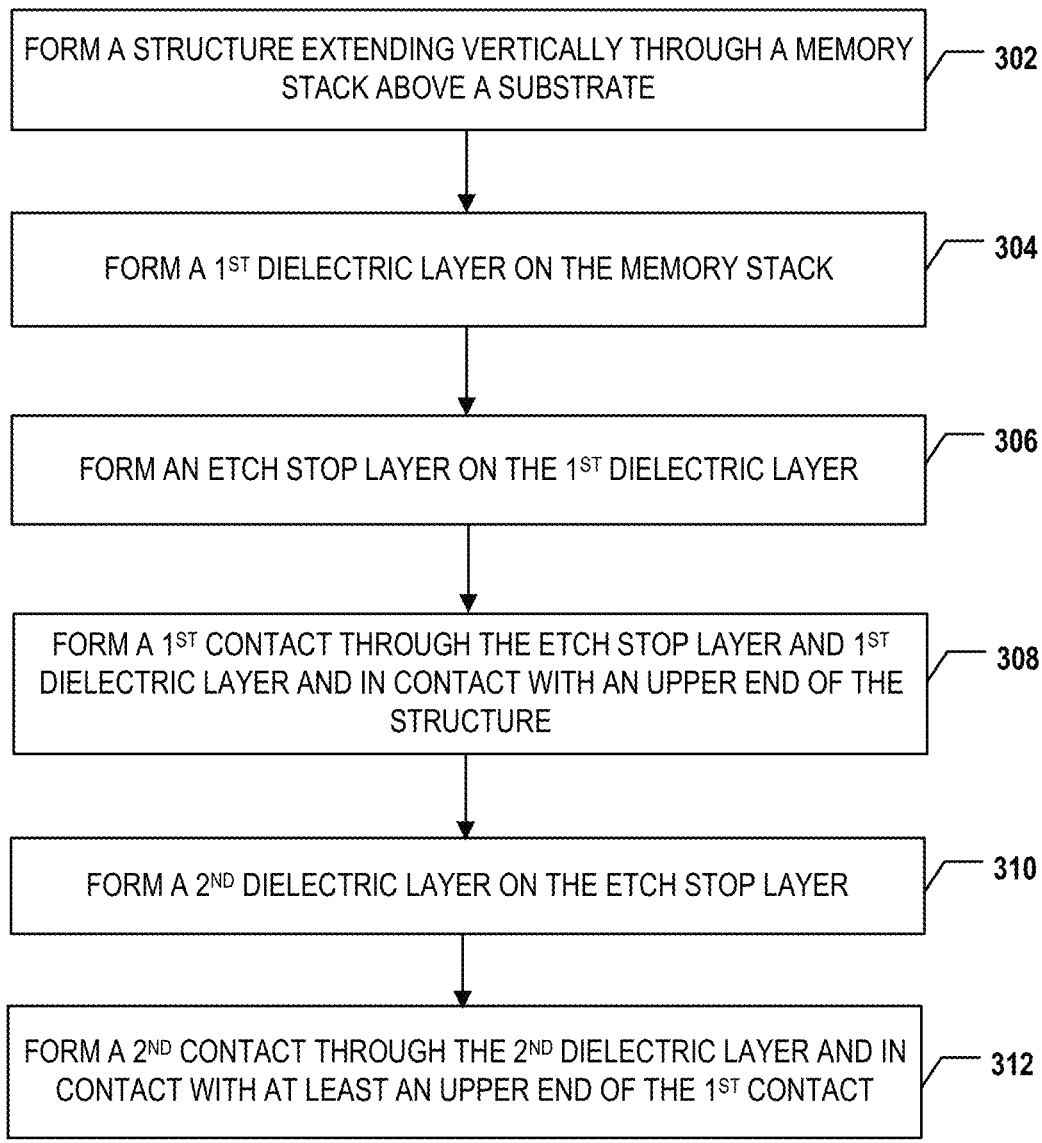
FIG. 3 illustrates a flowchart of a method for forming an exemplary 3D memory device with self-aligned contacts, according to some embodiments of the present disclosure.

Referring to FIG. 2A, a memory stack 204 including a plurality pairs of a conductive layer 206 and a dielectric layer 208 is formed above a silicon substrate 202. In some embodiments, memory stack 204 is formed by a "gate-first" process in which dielectric layers 208 and conductive layers 206 are alternatingly deposited on silicon substrate 202 using one or more thin film deposition processes including, but not limited to, chemical vapor deposition (CVD), physical vapor deposition (PVD), atomic layer deposition (ALD), or any combination thereof. In some embodiments, memory stack 204 is formed by a "gate-last" process in which a dielectric stack (not shown) including dielectric layers 208 and sacrificial layers (not shown) are alternatingly deposited on silicon substrate 202 using one or more thin film deposition processes including, but not limited to, CVD, PVD, ALD, or any combination thereof. Memory stack 204 can then be formed by a "gate-replacement" process, which replaces the sacrificial layers with conductive layers 206 using an etching process to remove the sacrificial layers and a thin film deposition process to deposit conductive layers 206 at the places where the sacrificial layers were formed.

As illustrated in FIG. 2A, a channel structure 210 extending vertically through interleaved dielectric layers 208 and conductive layers 206 of memory stack 204 is formed above silicon substrate 202. It is understood that although channel structure 210 is illustrated, any other suitable structures that extending vertically through memory stack 204, including slit structures (e.g., slit structure 103 in FIG. 1B) may be applicable as well although the detailed fabrication processes for forming those structures as known in the art are not described herein. To form channel structure 210, a channel hole is first etched through memory stack 204 (or the dielectric stack) using wet etching and/or dry etching, such as deep-ion reactive etching (DRIE). In some embodiments, the channel hole of channel structure 210 extends further through the top portion of silicon substrate 202. As illustrated in FIG. 2A, a semiconductor plug 218 can be formed by filling the lower portion of the channel hole with single-crystal silicon epitaxially grown from silicon substrate 202 in any suitable directions (e.g., from the bottom surface and/or side surface). The fabrication processes for epitaxially growing semiconductor plug 218 can include, but not limited to, vapor-phase epitaxy (VPE), liquid-phase epitaxy (LPE), molecular-beam epitaxy (MPE), or any combinations thereof.

As illustrated in FIG. 2A, a memory film 212 (including a blocking layer, a storage layer, and a tunneling layer) and a semiconductor channel 214 are formed along the sidewall of the channel hole of channel structure 210 and above semiconductor plug 218. In some embodiments, memory film 212 is first deposited along the sidewall of the channel hole and above semiconductor plug 218, and semiconductor channel 214 is then deposited over memory film 212. The blocking layer, storage layer, and tunneling layer can be subsequently deposited in this order using one or more thin film deposition processes, such as ALD, CVD, PVD, any other suitable processes, or any combination thereof, to form memory film 212. Semiconductor channel 214 can then be formed by depositing polysilicon on the tunneling layer using one or more thin film deposition processes, such as ALD, CVD, PVD, any other suitable processes, or any combination thereof.

Semiconductor channel 214 can be in contact with semiconductor plug 218 using, for example, a SONO punch process. In some embodiments, semiconductor channel 214 is deposited in the channel hole without completely filling the channel hole. As illustrated in FIG. 2A, a capping layer 216, such as a silicon oxide layer, is formed in the channel hole to fully or partially fill the remaining space of the channel hole using one or more thin film deposition processes, such as CVD, PVD, ALD, electroplating, electroless plating, or any combination thereof.

As illustrated in FIG. 2A, a channel plug 220 is formed in the upper portion of the channel hole of channel structure 210. A recess can then be formed in the upper portion of the channel hole by wet etching and/or drying etching parts of memory film 212, semiconductor channel 214, and capping layer 216 in the upper portion of the channel hole. Channel plug 220 can then be formed by depositing semiconductor materials, such as polysilicon, and/or metals, such as tungsten, into the recess by one or more thin film deposition processes, such as CVD, PVD, ALD, electroplating, electroless plating, or any combination thereof. Channel structure 210 is thereby formed through memory stack 204 (or the dielectric stack).

Method 300 proceeds to operation 304, as illustrated in FIG. 3, in which a first dielectric layer is formed on the memory stack. In some embodiments, the first dielectric layer includes silicon oxide. As illustrated in FIG. 2A, a first dielectric layer 222 is formed on memory stack 204 (or the dielectric stack). First dielectric layer 222 can be formed by depositing dielectric materials, such as silicon oxide, using one or more thin film deposition processes, such as CVD, PVD, ALD, or any combination thereof, on the upper end of channel structure 210 and the top surface of memory stack 204 (or the dielectric stack).

Method 300 proceeds to operation 306, as illustrated in FIG. 3, in which an etch stop layer is formed on the first dielectric layer. The etch stop layer can include a dielectric material including at least one of silicon nitride, silicon oxynitride, or high-k dielectrics. In some embodiments, the dielectric material includes silicon nitride. As illustrated in FIG. 2A, an etch stop layer 224 is formed on first dielectric layer 222. Etch stop layer 224 can be formed by depositing dielectric materials, such as silicon nitride, using one or more thin film deposition processes, such as CVD, PVD, ALD, or any combination thereof, on the top surface of first dielectric layer 222.

Method 300 proceeds to operation 308, as illustrated in FIG. 3, in which a first contact is formed through the etch stop layer and the first dielectric layer and in contact with an upper end of the structure. In some embodiments, to form the first contact, a first contact opening is etched through the etch stop layer and the first dielectric layer until being stopped by the structure, and the first contact opening is filled with a conductive material to form the first contact. In some embodiments, the conductive material includes a metal material, such as tungsten. In some embodiments, the upper end of the first contact is flush with a top surface of the etch stop layer.

As illustrated in FIG. 2A, an etch mask 226 is patterned on etch stop layer 224 with an etch opening 228 aligned with channel structure 210. Etch opening 228 can expose part of etch stop layer 224 that is to be removed later. Etch mask 226 can be patterned by first coating a photoresist layer using spin coating, followed by photolithography and photoresist development processes to form etch opening 228 aligned with channel structure 210. In some embodiments, a hard mask is patterned under the photoresist layer as part of etch mask 226 using wet etching and/or dry etching processes.

Figure 2B:
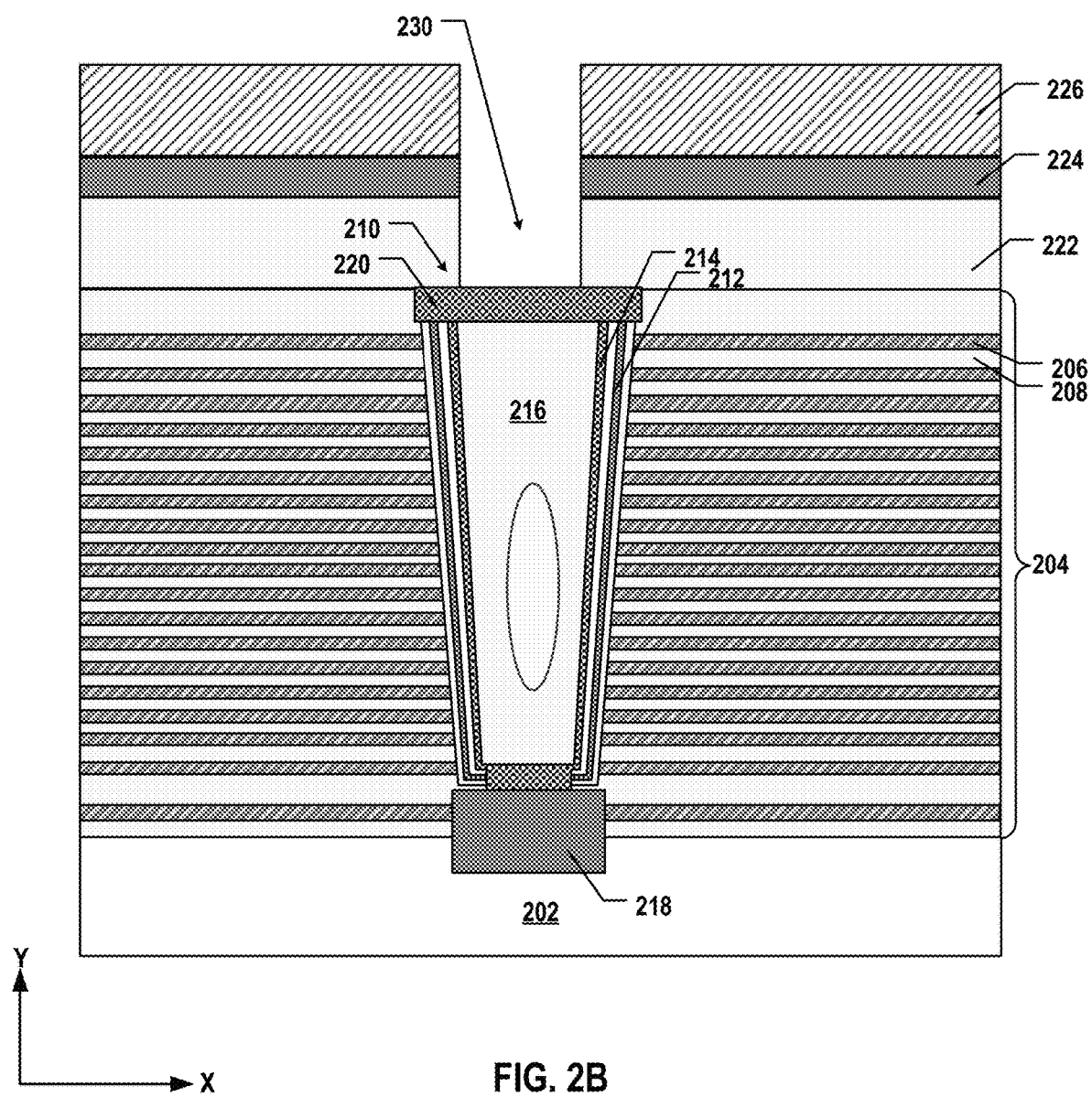

As illustrated in FIG. 2B, a first contact opening 230 is etched through etch stop layer 224 and first dielectric layer 222 until being stopped by the upper end of channel structure 210 (i.e., channel plug 220) using one or more wet etching and/or dry etching processes, such as RIE. First contact opening 230 can be etched from etch opening 228 (shown in FIG. 2A) of etch mask 226 as other areas of etch stop layer 224 and first dielectric layer 222 are covered by etch mask 226. As a result, the upper end of channel structure 210 can be exposed by first contact opening 230.

Figure 2C:
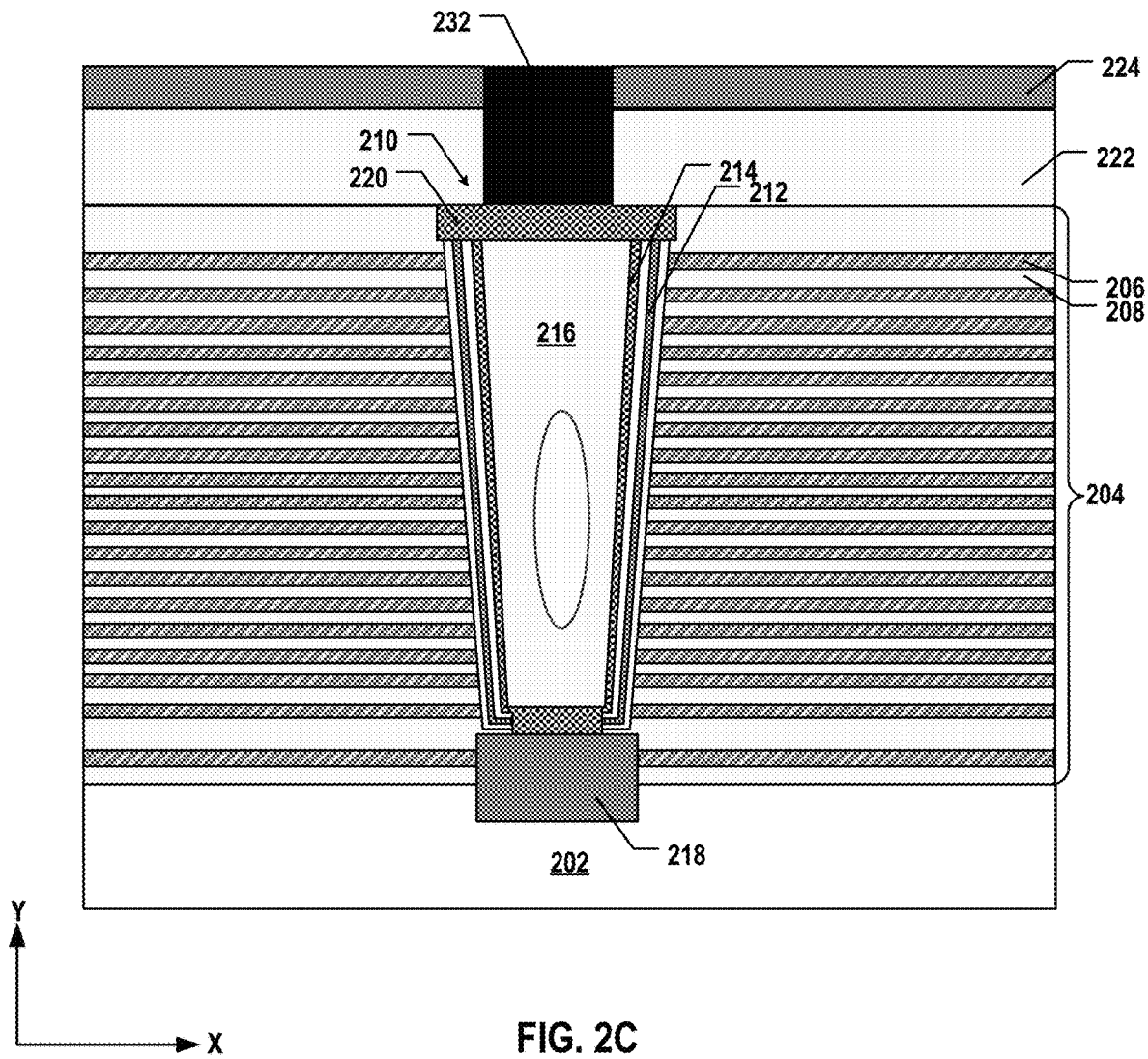

As illustrated in FIG. 2C, a first contact 232 is formed through etch stop layer 224 and first dielectric layer 222 and in contact with the upper end of channel structure 210 (i.e., channel plug 220). In some embodiments, to form first contact 232, first contact opening 230 (shown in FIG. 2B) is filled with a conductive material, such as a metal material (e.g., tungsten), using one or more thin film deposition processes, such as CVD, PVD, ALD, electroplating, electroless plating, or any combination thereof. A CMP process can be performed to remove the excess conductive material and planarize the top surface of etch stop layer 224.

Method 300 proceeds to operation 310, as illustrated in FIG. 3, in which a second dielectric layer is formed on the etch stop layer. In some embodiments, the second dielectric layer includes a dielectric material that is different from the dielectric material of the etch stop layer. In some embodiments, the etch selectivity between the dielectric material of the second dielectric layer and the dielectric material of the etch stop layer is not less than about 5:1. For example, the dielectric material of the second dielectric layer may include silicon oxide.

Figure 2D:
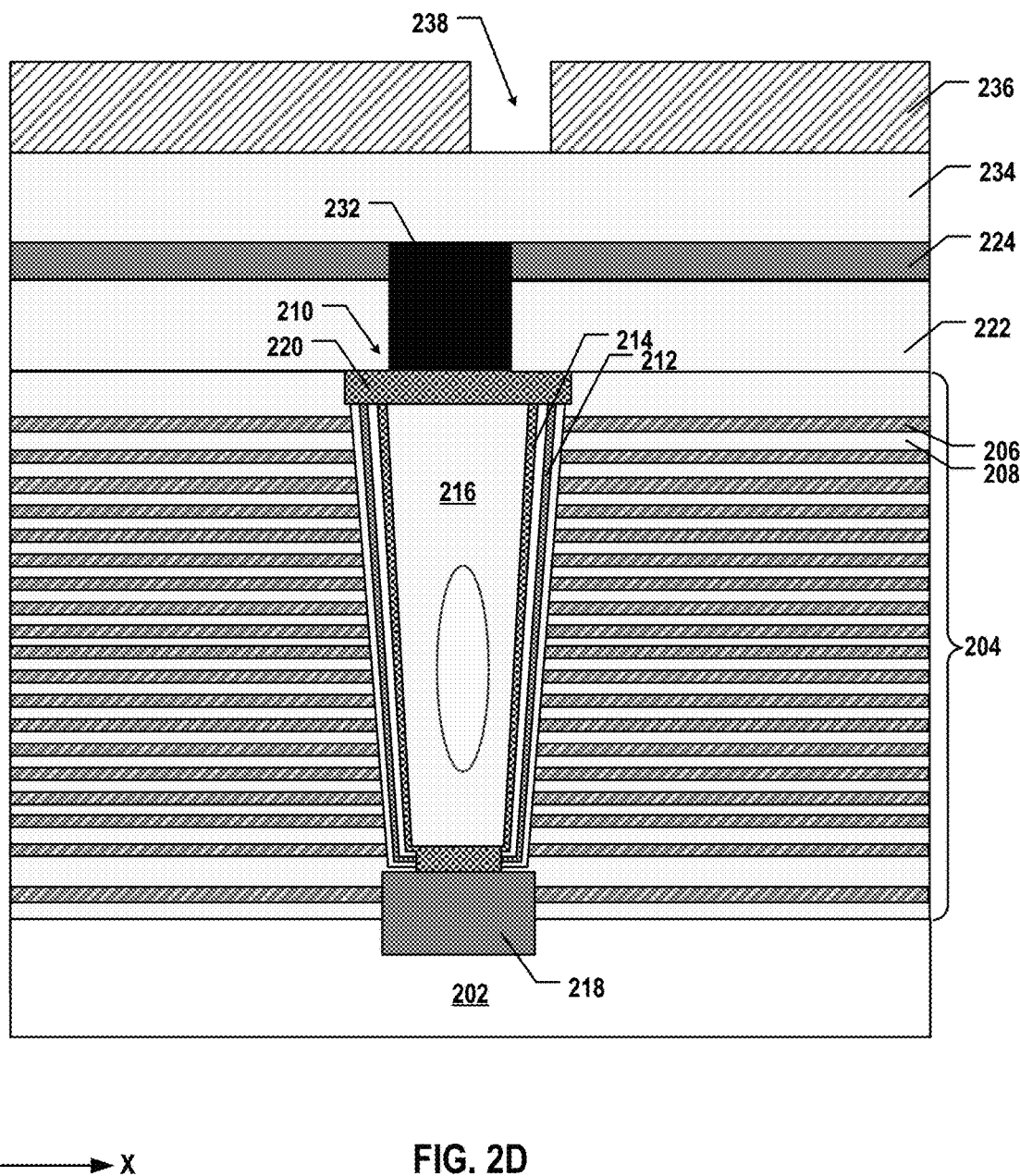

As illustrated in FIG. 2D, a second dielectric layer 234 is formed on etch stop layer 224. Second dielectric layer 234 can be formed by depositing dielectric materials, such as silicon oxide, using one or more thin film deposition processes, such as CVD, PVD, ALD, or any combination thereof, on the top surface of etch stop layer 224.

Method 300 proceeds to operation 312, as illustrated in FIG. 3, in which a second contact is formed through the second dielectric layer and in contact with at least an upper end of the first contact. In some embodiments, to form the first contact, a second contact opening is etched through the second dielectric layer until being stopped by the first contact and the etch stop layer, and the second contact opening is filled with a conductive material to form the second contact in contact with the upper end of the first contact and the etch stop layer. In some embodiments, the conductive material includes a metal material, such as tungsten. In some embodiments, a lower end of the second contact is flush with the top surface of the etch stop layer. In some embodiments, a critical dimension of the first contact is greater than a critical dimension of the second contact.

As illustrated in FIG. 2D, an etch mask 236 is patterned on second dielectric layer 234 with an etch opening 238 aligned with first contact 232. Etch opening 238 can expose part of second dielectric layer 234 that is to be removed later. Etch mask 236 can be patterned by first coating a photoresist layer using spin coating, followed by photolithography and photoresist development processes to form etch opening 238 aligned with first contact 232. In some embodiments, a hard mask is patterned under the photoresist layer as part of etch mask 236 using wet etching and/or dry etching processes. It is understood that etch opening 238 may not be well aligned with first contact 232, for example, only partially overlapping with first contact 232.

Figure 2E:
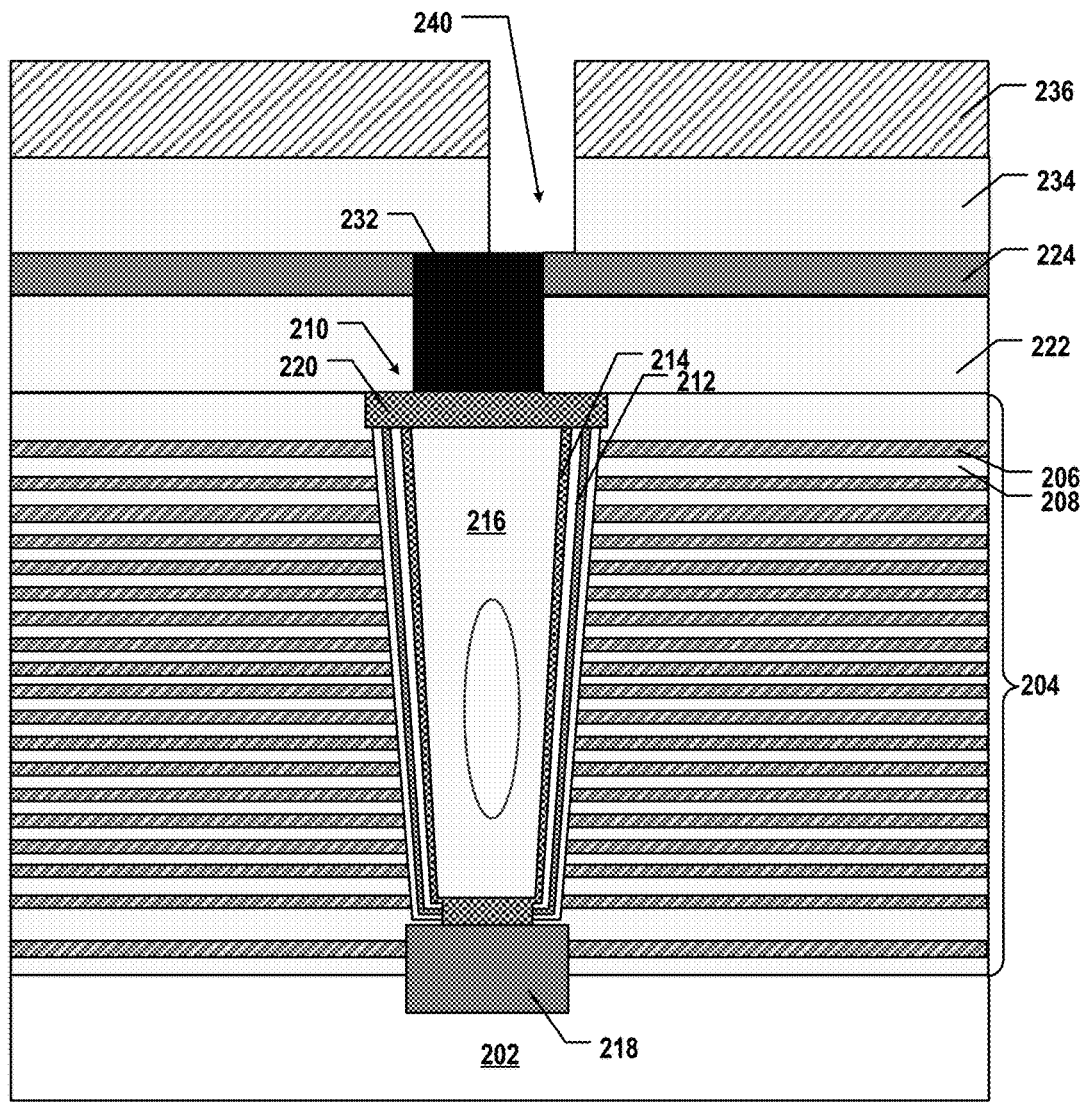

As illustrated in FIG. 2E, a second contact opening 240 is etched through second dielectric layer 234 until being stopped by the upper end of first contact 232 using one or more wet etching and/or dry etching processes, such as RIE. Second contact opening 240 can be etched from etch opening 238 (shown in FIG. 2D) of etch mask 236 as other areas of second dielectric layer 234 are covered by etch mask 236. As a result, the upper end of first contact 232 can be exposed by second contact opening 240. It is understood that in case etch opening 238 is not well aligned with first contact 232, for example, only partially overlapping with first contact 232, second contact opening 240 is etched through second dielectric layer 234 until being stopped by the upper end of first contact 232 as well as etch stop layer 224 due to the high etch selectivity (e.g., not less than about 5:1) between the dielectric materials of second dielectric layer 234 and etch stop layer 224 (e.g., silicon oxide and silicon nitride). That is, etch stop layer 224 can prevent the etching of second dielectric layer 234 to go further below to cause any short circuits after depositing a conductive material into second contact opening 240 even when etch opening 238 is not be well aligned with first contact 232 in some cases, which relaxes the alignment margin when forming etch opening 238 and second contact opening 240.

Figure 2F:
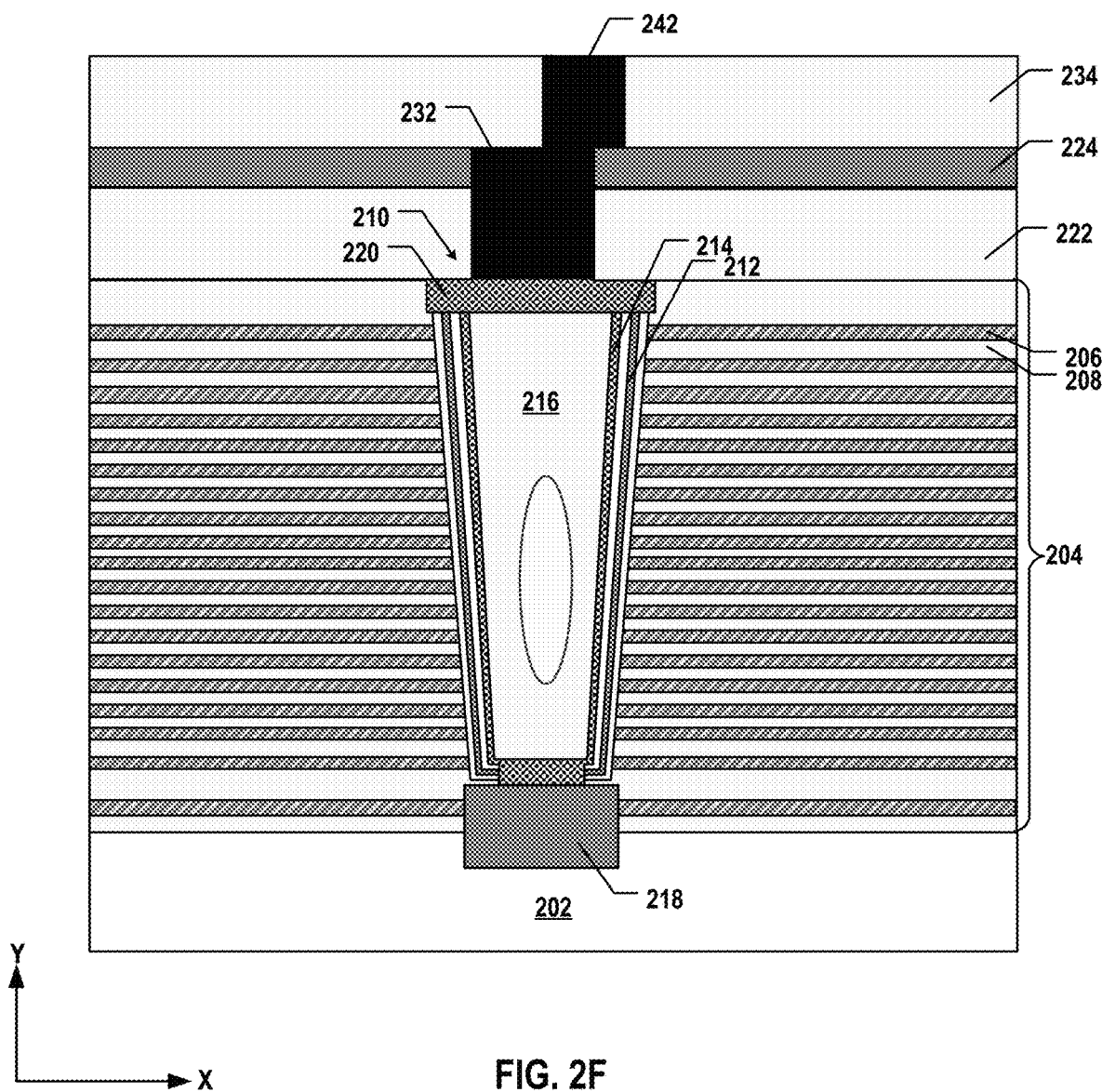

As illustrated in FIG. 2F, a second contact 242 is formed through second dielectric layer 234 and in contact with the upper end of first contact 232. In some embodiments, to form second contact 242, second contact opening 240 (shown in FIG. 2E) is filled with a conductive material, such as a metal material (e.g., tungsten), using one or more thin film deposition processes, such as CVD, PVD, ALD, electroplating, electroless plating, or any combination thereof. In some embodiments, the critical dimension of first contact 232 is greater than the critical dimension of second contact 242. For example, the diameter of first contact 232 (e.g., a via contact) may be greater than the diameter of second contact 242 (e.g., a via contact). It is understood that in some embodiments, second contact 242 may be well aligned with first contact 232, such that second contact 242 may fully lands on first contact 232 without being in contact with etch stop layer 224. It is further understood that even when second contact 242 is not well aligned with first contact 232, second contact 242 may land on first contact 232 and etch stop layer 224 without making any contact with structures below etch stop layer 224 to cause a short circuit.

According to one aspect of the present disclosure, a 3D memory device includes a substrate, a memory stack including interleaved conductive layers and dielectric layers above the substrate, a structure extending vertically through the memory stack, a first dielectric layer on the memory stack, an etch stop layer on the first dielectric layer, a second dielectric layer on the etch stop layer, a first contact through the etch stop layer and the first dielectric layer and in contact with an upper end of the structure, and a second contact through the second dielectric layer and in contact with at least an upper end of the first contact.

In some embodiments, the second contact is in contact with the upper end of the first contact and the etch stop layer.

In some embodiments, the second dielectric layer includes a first dielectric material, and the etch stop layer includes a second dielectric material different from the first dielectric material. In some embodiments, an etch selectivity between the first dielectric material and the second dielectric material is not less than about 5:1. In some embodiments, the first dielectric material includes silicon oxide. In some embodiments, the second dielectric material includes at least one of silicon nitride, silicon oxynitride, or high-k dielectrics.

In some embodiments, the structure is a channel structure or a slit structure.

In some embodiments, a critical dimension of the first contact is greater than a critical dimension of the second contact.

In some embodiments, the upper end of the first contact is flush with a top surface of the etch stop layer. In some embodiments, a lower end of the second contact is flush with the top surface of the etch stop layer.

According to another aspect of the present disclosure, a method for forming a 3D memory device is disclosed. A structure extending vertically through a memory stack including interleaved conductive layers and dielectric layers is formed above a substrate. A first dielectric layer is formed on the memory stack. An etch stop layer is formed on the first dielectric layer. A first contact is formed through the etch stop layer and the first dielectric layer and in contact with an upper end of the structure. A second dielectric layer is formed on the etch stop layer. A second contact is formed through the second dielectric layer and in contact with at least an upper end of the first contact.

In some embodiments, to form the second contact, a second contact opening is etched through the second dielectric layer until being stopped by the first contact and the etch stop layer, and the second contact opening is filled with a conductive material to form the second contact in contact with the upper end of the first contact and the etch stop layer.

In some embodiments, to form the first contact, a first contact opening is etched through the etch stop layer and the first dielectric layer until being stopped by the structure, and the first contact opening is filled with a conductive material to form the first contact.

In some embodiments, the second dielectric layer includes a first dielectric material, and the etch stop layer includes a second dielectric material different from the first dielectric material. In some embodiments, an etch selectivity between the first dielectric material and the second dielectric material is not less than about 5:1. In some embodiments, the first dielectric material includes silicon oxide. In some embodiments, the second dielectric material includes at least one of silicon nitride, silicon oxynitride, or high-k dielectrics.

In some embodiments, a critical dimension of the first contact is greater than a critical dimension of the second contact.

In some embodiments, the upper end of the first contact is flush with a top surface of the etch stop layer. In some embodiments, a lower end of the second contact is flush with the top surface of the etch stop layer.

According to still another aspect of the present disclosure, a method for forming a 3D memory device is disclosed. A channel structure extending vertically through a memory stack including interleaved conductive layers and dielectric layers is formed above a substrate. A first silicon oxide layer is deposited on the memory stack. A silicon nitride layer is deposited on the first silicon oxide layer. A first contact opening is etched through the silicon nitride layer and the first silicon oxide layer until being stopped by an upper end of the channel structure. The first contact opening is filled with a metal material to form a first contact in contact with the upper end of the channel structure. A second silicon oxide layer is deposited on the silicon nitride layer. A second contact opening is etched through the second silicon oxide layer until being stopped by an upper end of the first contact and the silicon nitride layer. The second contact opening is filled with the metal material to form the second contact in contact with the upper end of the first contact and the silicon nitride layer.

In some embodiments, the metal material includes tungsten.

In some embodiments, a critical dimension of the first contact is greater than a critical dimension of the second contact.

In some embodiments, the upper end of the first contact is flush with a top surface of the etch stop layer. In some embodiments, a lower end of the second contact is flush with the top surface of the silicon nitride layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising interleaved conductive layers and dielectric layers;
   a channel structure extending vertically through the memory stack, an upper end of a plug of the channel structure being coplanar with an upper surface of the memory stack;
   a first dielectric layer having a first dielectric material in contact with the memory stack and the plug;
   an intermedia dielectric layer on the first dielectric layer and having a second dielectric material different from the first dielectric material;
   a second dielectric layer on the intermedia dielectric layer;
   a slit structure extending along a lateral direction to separate the memory stack, and comprising a lower portion having polysilicon and an upper portion having metal;
   a first contact penetrating the intermedia dielectric layer and the first dielectric layer, the first contact being in contact with the plug of the channel structure, a first lateral dimension of an upper end of the first contact is not less than a second lateral dimension of a lower end of the first contact;
   a second contact penetrating the second dielectric layer and in contact with at least the upper end of the first contact;
   a third contact penetrating the intermedia dielectric layer and the first dielectric layer, the third contact being in contact with the upper portion of the slit structure; and
   a fourth contact penetrating the second dielectric layer and in contact with at least the upper end of the third contact.

2. The 3D memory device of claim 1, wherein the second contact is further in contact with the intermedia dielectric layer.

3. The 3D memory device of claim 1, wherein:
   the first dielectric material is silicon oxide; and
   the second dielectric material is silicon nitride.

4. The 3D memory device of claim 1, wherein a first area of a lower end of the second contact is less than a second area of the upper end of the first contact.

5. The 3D memory device of claim 4, and a third area of a contacting region between the lower end of the second contact and the upper end of the first contact is less than the first area.

6. The 3D memory device of claim 1, wherein the first dielectric layer and the second dielectric layer comprise a first dielectric material, and the intermedia dielectric layer comprises a second dielectric material different from the first dielectric material.

7. The 3D memory device of claim 6, wherein an etch selectivity between the first dielectric material and the second dielectric material is not less than about 5:1.

8. The 3D memory device of claim 6, wherein:
   the first dielectric material comprises silicon oxide; and
   the second dielectric material comprises at least one of silicon nitride, silicon oxynitride, or high dielectric constant (high-k) dielectrics.

9. The 3D memory device of claim 1, wherein the upper end of the first contact is coplanar with a top surface of the intermedia dielectric layer.

10. The 3D memory device of claim 9, wherein a side of the first contact is straight smooth from the upper end to the lower end.

11. A three-dimensional (3D) memory device, comprising:
    a memory stack comprising interleaved conductive layers and dielectric layers;
    a channel structure penetrating the memory stack in a vertical direction, and including a plug embedded in the memory stack;
    a dielectric stack on the memory stack, comprising:
      a first dielectric layer and a second dielectric layer having a first dielectric material, and
      an intermedia dielectric layer between the first dielectric layer and the second dielectric layer, and having a second dielectric material different from the first dielectric material;
    a slit structure extending along a lateral direction to separate the memory stack, and comprising a lower portion having polysilicon and an upper portion having metal;
    a first contact structure penetrating the dielectric stack and being in contact with the plug, the first contact structure comprising a lower contact portion penetrating the first dielectric layer and the intermedia dielectric layer, and an upper contact portion penetrating the second dielectric layer; and
    a second contact structure penetrating the dielectric stack and being in contact with the upper portion of the slit structure, the second contact structure comprising a lower contact portion penetrating the first dielectric layer and the intermedia dielectric layer, and an upper contact portion penetrating the second dielectric layer.

12. The 3D memory device of claim 11, wherein:
    the lower contact portion having an average first lateral dimension; and
    the upper contact portion having a second lateral dimension less than the first lateral dimension.

13. The 3D memory device of claim 11, wherein a side of the lower contact portion is straight smooth from an upper end to a lower end.

14. The 3D memory device of claim 11, wherein the lower contact portion does not include a surface in contact with a top surface of the first dielectric layer or a bottom surface of the intermedia dielectric layer.

15. The 3D memory device of claim 11, wherein:
the first dielectric material is silicon oxide; and
the second dielectric material is silicon nitride.

16. The 3D memory device of claim 11, wherein an etch selectivity between the first dielectric material and the second dielectric material is not less than about 5:1.

17. The 3D memory device of claim 16, wherein:
the first dielectric material comprises silicon oxide; and
the second dielectric material comprises at least one of silicon nitride, silicon oxynitride, or high dielectric constant (high-k) dielectrics.

18. The 3D memory device of claim 11, wherein the lower contact portion includes a top surface in contact with a lower surface of the second dielectric layer.

19. The 3D memory device of claim 18, wherein the upper contact portion includes a bottom surface in contact with a top surface of intermedia dielectric layer.

20. The 3D memory device of claim 19, wherein the top surface of the lower contact portion and the bottom surface of the upper contact portion are flush with an interface between the intermedia dielectric layer and the second dielectric layer.

* * * * *